United States Patent

[11] 3,601,669

[72] Inventors Jerry D. Merryman; Edward M. Ruggiero, both of Dallas, Tex.

[21] Appl. No. 847,750

[22] Filed May 7, 1969

Division of Ser. No. 671,821, Sept. 29, 1967, Patent No. 3,501,615

[45] Patented Aug. 24, 1971

[73] Assignee Texas Instruments Incorporated Dallas, Tex.

[54] INTEGRATED HEATER ELEMENT ARRAY AND DRIVE MATRIX THEREFOR

7 Claims, 5 Drawing Figs.

[52] U.S. Cl. .......... 317/235 R, 317/234 R, 317/235 E, 317/235 F, 317/235 Q, 219/201, 219/216, 307/303, 346/76

[51] Int. Cl. .......... H01l 19/00

[50] Field of Search .......... 317/235, 22.1, 22.11, 22, 29, 1; 219/216, 201; 307/303; 346/76

[56] References Cited

UNITED STATES PATENTS

| | | | |
|---|---|---|---|
| 3,475,664 | 10/1969 | DeVries .......... | 317/235 |
| 3,478,418 | 11/1969 | Pomante .......... | 29/574 |
| 3,496,333 | 2/1970 | Alexander et al. .......... | 219/216 |
| 3,489,961 | 1/1970 | Frescura et al. .......... | 317/235 |

*Primary Examiner*—John W. Huckert

*Assistant Examiner*—B. Estrin

*Attorneys*—Samuel M. Mims, Jr., James O. Dixon, Andrew M. Hassell, Harold Le Vine, Melvin Sharp, Gerald B. Epstein and John E. Vandigriff

ABSTRACT: Thermal display including an air isolated integrated semiconductor circuit forming a semiconductor heater element array joined by a metallic connecting pattern which extends out over the heating elements to interconnect selected ones of them and a PN junction isolated integrated semiconductor drive matrix for the heating element array positioned in the same plane as the heating element array. The PN junction isolated integrated semiconductor drive matrix and the semiconductor heating element array are concurrently formed in the same semiconductor substrate and the heating element array is air isolated to provide a high degree of electrical and thermal isolation for the heating element array while both are located in the same plane on a larger support. The thermally sensitive material on which a dynamic display is formed or on which a permanent display is printed is in direct contact with the monocrystalline semiconductor material of the heating element array and can be passed over the heating element array and the drive matrix.

INVENTOR
JERRY D. MERRYMAN
EDWARD M. RUGGIERO

INTEGRATED HEATER ELEMENT ARRAY AND DRIVE MATRIX THEREFOR

Thermal display including an air isolated integrated semiconductor circuit forming a semiconductor heater element array joined by a metallic connecting pattern which extends out over the heating elements to interconnect selected ones of them and a PN junction isolated integrated semiconductor drive matrix for the heating element array positioned in the same plane as the heating element array. The PN junction isolated integrated semiconductor drive matrix and the semiconductor heating element array are concurrently formed in the same semiconductor substrate and the heating element array is air isolated to provide a high degree of electrical and thermal isolation for the heating element array while both are located in the same plane on a larger support. The thermally sensitive material on which a dynamic display is formed or on which a permanent display is printed is in direct contact with the monocrystalline semiconductor material of the heating element array and can be passed over the heating element array and the drive matrix.

The present invention relates to thermal displays of the type having an array of heater elements selectively energized to provide an information display on thermally sensitive material and more particularly to an integrated semiconductor heater element array and drive matrix therefore and to methods of making them.

An object of the present invention is to provide an improved and simpler thermal display.

An object of the present invention is to provide an integrated semiconductor circuit tailored to meet different electrical and thermal requirements useful for a thermal display.

Still another object of the present invention is to provide an improved and simpler method of fabricating an integrated semiconductor circuit useful for a thermal display.

Other objects, features, and advantages of the invention may be best understood by reference to the following detailed description taken in conjunction with the accompanying drawings in which like reference numerals indicate like parts and in which.

Figures 1, 2:
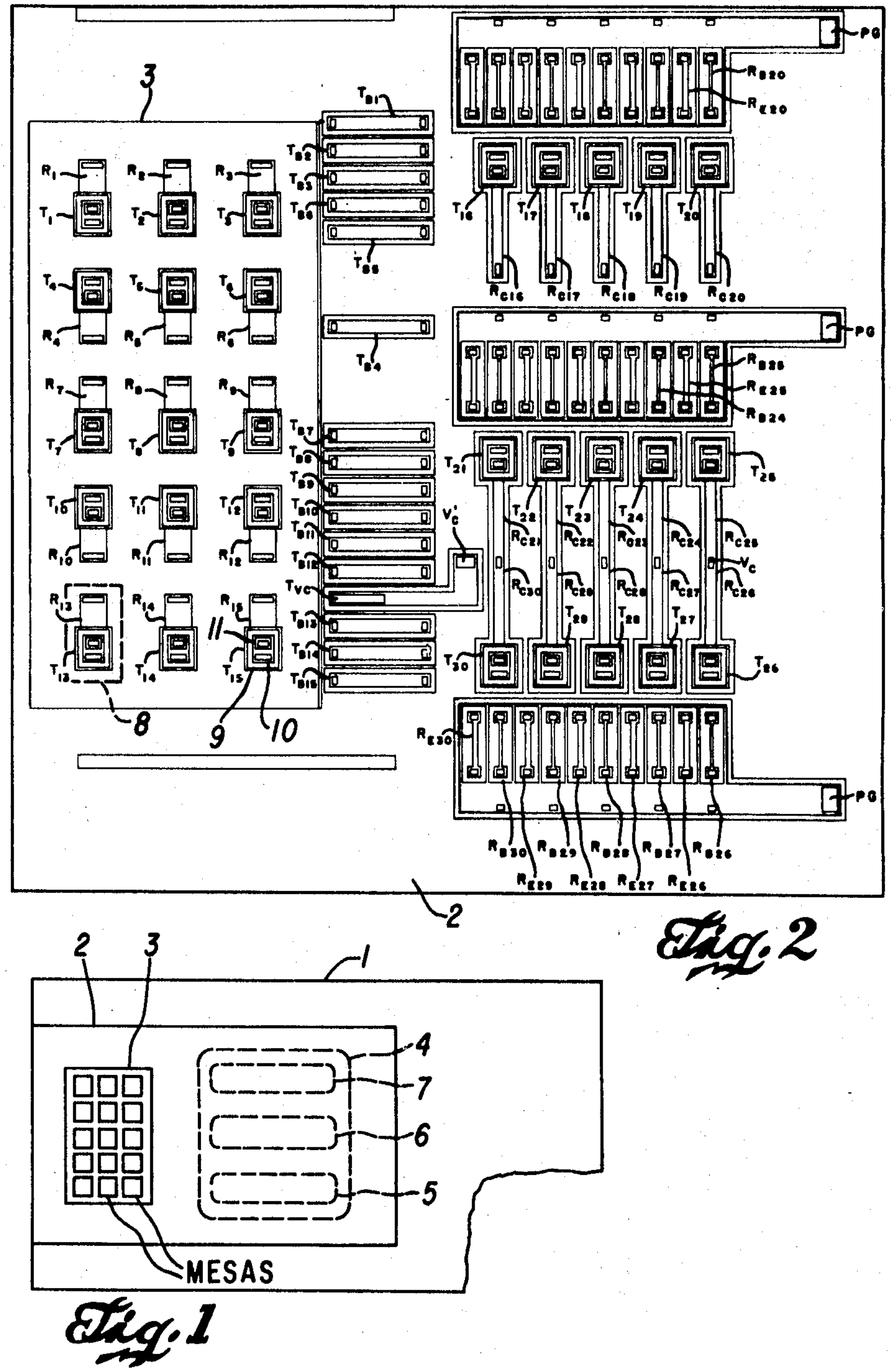
FIG. 1 illustrates an integrated semiconductor heater element array and drive matrix according to the invention.
FIG. 2 illustrates an intermediate structure in the fabrication of integrated semiconductor heater element array and drive matrix of FIG. 1.

FIG. 1 illustrates a three by five heater element array of semiconductor mesas located within the window 3 and the drive matrix 4 over which thermally sensitive material is positioned to form a dynamic information display of the type described in U.S. Pat. No. 3,323,341 by J. W. Blair et al. in which the described thermochronic materials are used or over which is passed a specially treated thermally sensitive material to form a permanent information display or printer of the type described in U.S. Pat. No. 3,496,333 by Emmons et al.

A monocrystalline silicon semiconductor wafer 2 is mounted on a larger insulating support 1 which may be any suitable material, for example, ceramic, glass or sapphire, by way of an insulating adhesive having good thermal and electrical insulating properties such as epoxy.

Each heater element of the array comprises a monocrystalline semiconductor body in a mesa shape and contains a heater element formed therein at the underside of the mesa adjacent the support 1 so that when the heater element is energized, a "hot-spot" is formed at the top surface of the mesa to provide a localized dot on the thermally sensitive material above it. A group of selectively energized heater elements forms a group of dots on the thermally sensitive material defining a character or information representation displayed on the thermally sensitive material.

The mesas comprising the heater element array are air isolated from each other and joined by a metallic connecting pattern underneath the mesas between the semiconductor wafer 2 and the support 1 which pattern interconnects the heater elements in the mesas in the desired circuit configuration. The drive matrix for selectively energizing the heater elements and supplying the desired power to the heater elements is located in the semiconductor for wafer 2 in the area generally designated as 4. The circuit elements forming the drive matrix are integral within the semiconductor wafer 2, PN junction isolated from one another and interconnected in the desired circuit configuration by a metallic connecting pattern underneath the wafer 2 between the wafer 2 and the support 1. The heating element array and the drive matrix are also interconnected in the desired circuit configuration by the metallic connecting pattern between the wafer 2 and the support 1.

The semiconductor wafer 2 is integral except within the window 3 in which are located the air isolated heater elements and consequently the top surface of the semiconductor wafer 2 presents a good, more uniform support for the positioning or passing of the thermally sensitive material over the heater element array.

The metallic connecting pattern located between the semiconductor wafer 2 and the support 1 extends out into bonding pads located above the openings 5, 6 and 7 in the support 1 so that external connection can be made to these bonding pads through the openings at the underside of support 1. Whereas, the external connections are formed at the underside of support 1 and are removed from the thermally sensitive material located above the mesas. The metallic connecting pattern located between the semiconductor wafer 2 and the support 1 mechanically and electrically joins the air isolated mesas and electrically connects them to the circuit elements of the drive matrix and is supported in the epoxy adhesive resting between the semiconductor wafer 2 and the support 1.

Each mesa contains a transistor-resistor pair which is selectively energized so that the power dissipated by the resistor causes the "hot-spot" at the top surface of the selected mesa. The transistor in each mesa provides an active control or amplifying function in the manner that the heat generated by it facilitates the creation of the "hot-spot." Moreover, an active element in each mesa lessens the need for amplification of signals that would otherwise have to be provided externally to the heating element array and allows the heating element array to operate directly from low power driving sources.

Figure 5:
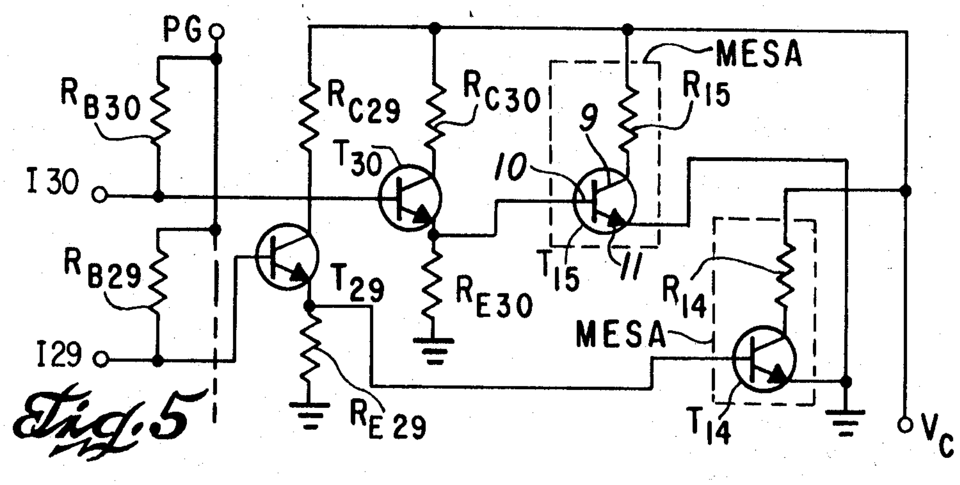
FIG. 5 illustrates the electrical circuit embodied in the integrated heater element array and drive matrix of FIG. 1.

The transistor-resistor pair in each mesa illustrated in FIG. 5, transistor $T_{14}$ and resistor $R_{14}$ for example along with its associated drive circuitry, transistor $T_{29}$, resistor $R_{C29}$, resistor $R_{E29}$ and resistor $R_{B29}$ for example. Each transistor-resistor pair is interconnected in the manner that one end of the resistor is connected to the collector of the transistor, the other end of the resistor being connected to a positive voltage source $V_C$, the emitter of the transistor being connected to ground and the base of the transistor being connected to the drive circuit (i.e. the emitter of the associated transistor in the drive circuit).

Upon the simultaneous application of positive pulses at the input terminal I29 and the terminal PG, the transistor $T_{29}$ is turned on, causing the voltage at the emitter of transistor $T_{29}$ to become more positive and trigger the transistor $T_{14}$ causing the "hot-spot" at the surface of the mesa in which the transistor $T_{14}$ and resistor $R_{14}$ are located. The line PG is connected to all the transistors $T_{29}$, $T_{30}$ through the resistors $R_{B29}$ $R_{B30}$ in the manner that the simultaneous appearance of a positive pulse at PG and a selected one of the inputs I29 or I30 causes the selected transistor $T_{29}$ or $T_{30}$ to turn on and in turn trigger the selected heating element.

In the example given, a three by five heating element array, there are 15 mesas, a corresponding 15 transistor-resistor pairs ($T_{14}$–$R_{14}$, $T_{15}$–$R_{15}$), a corresponding 15 drive transistors ($T_{29}$, $T_{30}$) and a corresponding 15 inputs (I29, I30).

The construction of the heater element array and the drive matrix of FIG. 1 may be better understood from the process of fabricating it.

Referring to FIG. 2, there is illustrated a integral monocrystalline semiconductor wafer 2 of P-type silicon. The transistor-resistor pairs for the heating elements comprise diffused regions in the surface of the wafer 2 and are illustrated as $T_1$ through $T_{15}$ and respectively $R_1$ through $R_{15}$ located in the area designated 3. 8 illustrates the area which is to be a mesa shape. Whereas, each transistor $T_{15}$ for example comprises a diffused N-type collector region 9, a diffused P-type base region 10, and a diffused N-type emitter region 11. Resistor $R_{15}$ for example comprises a diffused N-type region made at the same time as the N-type collector diffusion and is integral therewith so that one end of the resistor 15 is ohmically connected to the collector 9 internally of the semiconductor material.

The drive transistors $T_{16}$–$T_{30}$ each comprise an N-type diffused collector region, P-type diffused base region and an N-type diffused emitter region. Each drive transistor $T_{16}$–$T_{30}$ has associated therewith a collector resistor respectively $R_C$ 16–$R_C$ 30. The collector resistors $R_{C16}$–$R_{C30}$ each comprise an N-type diffused region made at the same time as the respective collector diffusion of the drive transistor in the manner that one end of the collector resistor is integral with the collector of its associated drive transistor. Whereas, one end of the collector resistor $R_{C16}$–$R_{C30}$ are respectively connected internally of the semiconductor material to the collectors of the drive transistors $T_{16}$14 $T_{30}$. The diffused resistors $R_{C21}$–$R_{C25}$ have one end internally connected in the semiconductor material respectively to one end of the diffused resistors $R_{C30}$, $R_{C29}$, $R_{C28}$, $R_{C27}$, and $R_{C26}$. The base resistors $R_{B16\text{-}30}$ are diffused *P*-type regions in the surface of the semiconductor wafer 2. These base resistors are to be connected to the base electrodes of the respective drive transistors $T_{16}$–$T_{30}$. The emitter resistors $R_{E16\text{-}30}$ are diffused P-type regions in the surface of semiconductor wafer 2 and are to be connected to the emitter electrodes of the respective drive transistors $T_{16}$–$T_{30}$. A diffused N-type region in the surface of the semiconductor wafer surrounds each of the P-type diffused regions comprising the base and emitter resistors $RB_{16\text{-}30}$ and $R_{E16\text{-}30}$ in order to provide the desired PN junction isolation between the circuit elements in the semiconductor material. Heavily doped N-type regions $T_{B1}$–$T_{B15}$ comprise conductive tunnels using, for the semiconductor wafer 2 for providing ohmic electrical connection between the base electrodes of the respective transistors $T_1$–$T_{15}$ and the various circuit elements in the drive matrix. A heavily doped N-type diffused region $T_{VC}$ provides a conductive tunnel in the semiconductor material. Three heavily doped N-type diffused regions PG are provided in the surface of the semiconductor wafer 2 respectively near the three groups of resistors $R_{B16\text{-}20}$–$R_{E16\text{-}20}$, $R_{B21\text{-}25}$–$R_{E21\text{-}25}$ and $R_{B26\text{-}30}$–$R_{E26\text{-}30}$. The PN junction formed between an N-type tunnel and the subjacent P-type substrate isolates the tunnels from each other and from the other circuit elements.

The transistors, resistors, tunnels and isolating junctions are formed in the surface of wafer 2 utilizing the planar process in which an oxide film is thermally grown on the P-type silicon wafer of the desired resistivity by placing it in a furnace at an elevated temperature and passing an oxidizing agent over it. The resulting silicon dioxide film acts as a masking medium against the impurities which are later diffused into the wafer. Holes are produced in the oxide film to allow subsequent diffusion processes to form the transistor, resistor, tunnel and isolating functions. These holes which are patterns of the desired circuit elements, tunnels and isolating regions are produced by photolithographic techniques. Contacts and interconnections between the circuit elements are made by similar photolithographic techniques using, for example, evaporated aluminum over the oxide to form a metallic pattern connecting the circuit elements together and terminating in bonding pads for external connections. The connecting pattern comprises conductive strips on the oxide film extending into openings in the oxide film for providing the desired connections and can be formed in the manner described in copending Pat. application Ser. No. 645,539 filed June 5, 1967, entitled "Method of Making Semiconductor Devices" by Jack S. Kilby which is assigned to the assignee of the present application.

Figure 3:
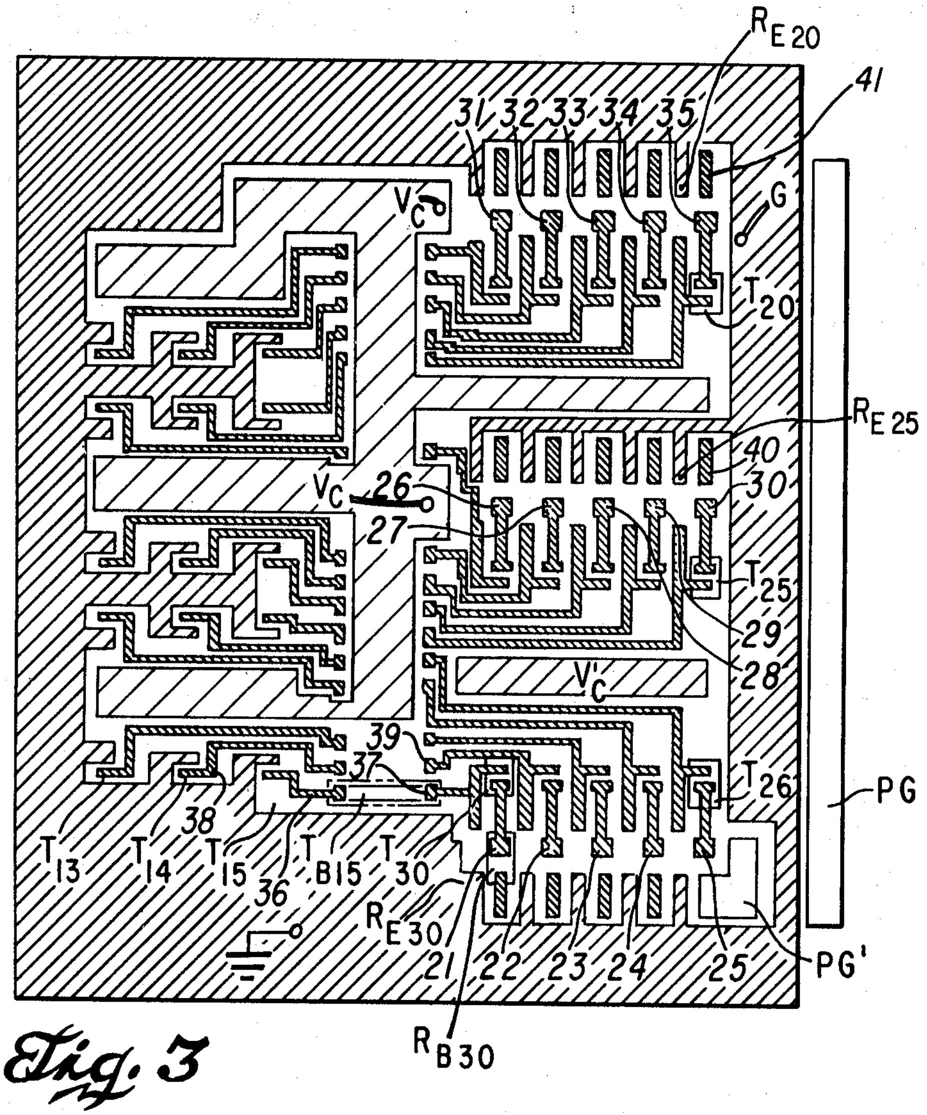
FIG. 3 illustrates the interconnection pattern of the heater elements and drive matrix on the surface of the structure of FIG. 2.

The metallic connecting pattern formed on the oxide on the semiconductor wafer 2 is illustrated in FIG. 3. A large conductive ground plane designed "ground" in FIG. 3 interconnects all the emitters of transistors $T_1$–$T_{15}$ and interconnects one end of all of the emitter resistors $R_{E16\text{-}30}$. $R_{E20}$, $R_{E25}$ and $R_{E30}$ are illustrated in FIG. 3 to show the place where the ground plane connects to these emitter resistors. The conductive strip $V_C$ interconnects one end of all the resistors $R_1$–$R_{15}$ and one end of the collector resistors $R_{C16\text{-}20}$. The conductive strip $V'_C$ interconnect the common terminals of the collector resistors $R_{C21}$–$R_{C30}$ (designated $V_C$ in FIG. 2) and one end of the tunnel $T_{VC}$(designated $V'_C$ in FIG. 2). Conductive strip 36 connects the base of transistor $T_{15}$ to one end of the tunnel $T_{B15}$ and conductive strip 37 connects the other end of the tunnel $T_{B15}$ top the emitter of transistor $T_{30}$ and to one end of the emitter resistor $R_{E30}$. The conductive strip 38 connects the base of transistor $T_{14}$ to one end of the tunnel $T_{B14}$ and conductive strip 39 connects the other end of the tunnel $T_{B14}$ to the emitter of transistor 29 and to one end of emitter resistor $R_{E29}$. In a like manner, the bases of all the transistors $T_1$–$T_{15}$ are connected by way of the tunnels $T_{B1\text{-}15}$ to the emitters of transistors $T_{16\text{-}30}$ and the emitter resistors $R_{E16\text{-}30}$. Conductive strips 21–35 respectively connect to the bases of transistors 30, 29, 28, 27, 26, 21, 22, 23, 24, 25, 16, 17, 18, 19 and 20 and to one end of their base resistors. The enlarged portions of 21–35 will later act as bonding pads for external connection and more specifically the inputs to selectively energize the heater elements. Whereas, the bonding pad 21 of FIG. 3 corresponds to the input 130 of FIG. 5 and the bonding pad 22 of FIG. 3 corresponds to the input 129 of FIG. 5.

The other ends of the base resistors $R_{B16\text{-}30}$ are connected to the tunnels PG illustrated in FIG. 2 and the ends of these tunnels are interconnected by the conductive strip PG in FIG. 3. For example, the base resistor $R_{B20}$ has its other end connected to the tunnel PG at the top of FIG. 2 by way of the conductive strip 41 illustrated in FIG. 3, the base resistor $R_{B20}$ has its other end connected to the tunnel PG illustrated in the middle of FIG. 2 by way of the conductive strip 40 illustrated in FIG. 3 and the base resistor $R_{B26}$ has its other end connected to the tunnel PG illustrated at the bottom of FIG. 2 by way of the conductive strip PG′ illustrated in FIG. 3.

It should be mentioned that where a conductive strip crosses over a tunnel, for example, the conductive strip $V_C$ crossing over the tunnels $T_{B1}$–$T_{B10}$, the silicon oxide insulating layer on the surface of the semiconductor wafer insulates the conductive strip from the conductive tunnel so that there is no electrical interference.

Accordingly, the drive matrix being more complex and requiring more circuit elements than the heating element array occupies an area of the semiconductor wafer larger than that of the heating element array and is near the heating element array while the two are fabricated during the same process operations and subjected to the same environments. The need for external driving circuitry is eliminated and the connecting pathway reduced.

After the semiconductor wafer is processed and includes the heater element array and the drive matrix with the desired connecting pattern as illustrated in FIG. 3, the wafer is turned upside down and mounted on a larger insulating support 1 in accordance with the procedure described in copending U.S. Pat. application No. 650,821 by Edward M. Ruggiero, filed July 3, 1967, entitled "Thermal Displays using Air Isolated Integrated Circuits and Methods of Making Same" and assigned to the assignee of the present application. Whereas, a parting agent comprising photoresist material is selectively applied over the bonding pad areas designated by points 21–35, PG′, $R_{E30}$, $V_C$ and G in FIG. 3. An epoxy adhesive is then applied over the semiconductor wafer on the metallic connecting pattern, the silicon oxide and the photoresist material. The epoxy adhesive adheres to the silicon oxide and the metallic connecting pattern but does not adhere to the photoresist material. The semiconductor wafer is then turned upside down and mounted on the insulating support 1 as illustrated in FIG. 1 with the bonding pads 31–35, $V_C$ overlying the opening 5, the bonding pads 26–30 and $V_C$ overlying the opening 6 and the bonding pads 21–25. $R_{E30}$ and PG' overlying the opening 7. These bonding pads are aligned with the openings 5–7 in such a manner that they will be accessible through the openings in the support.

Figure 4:
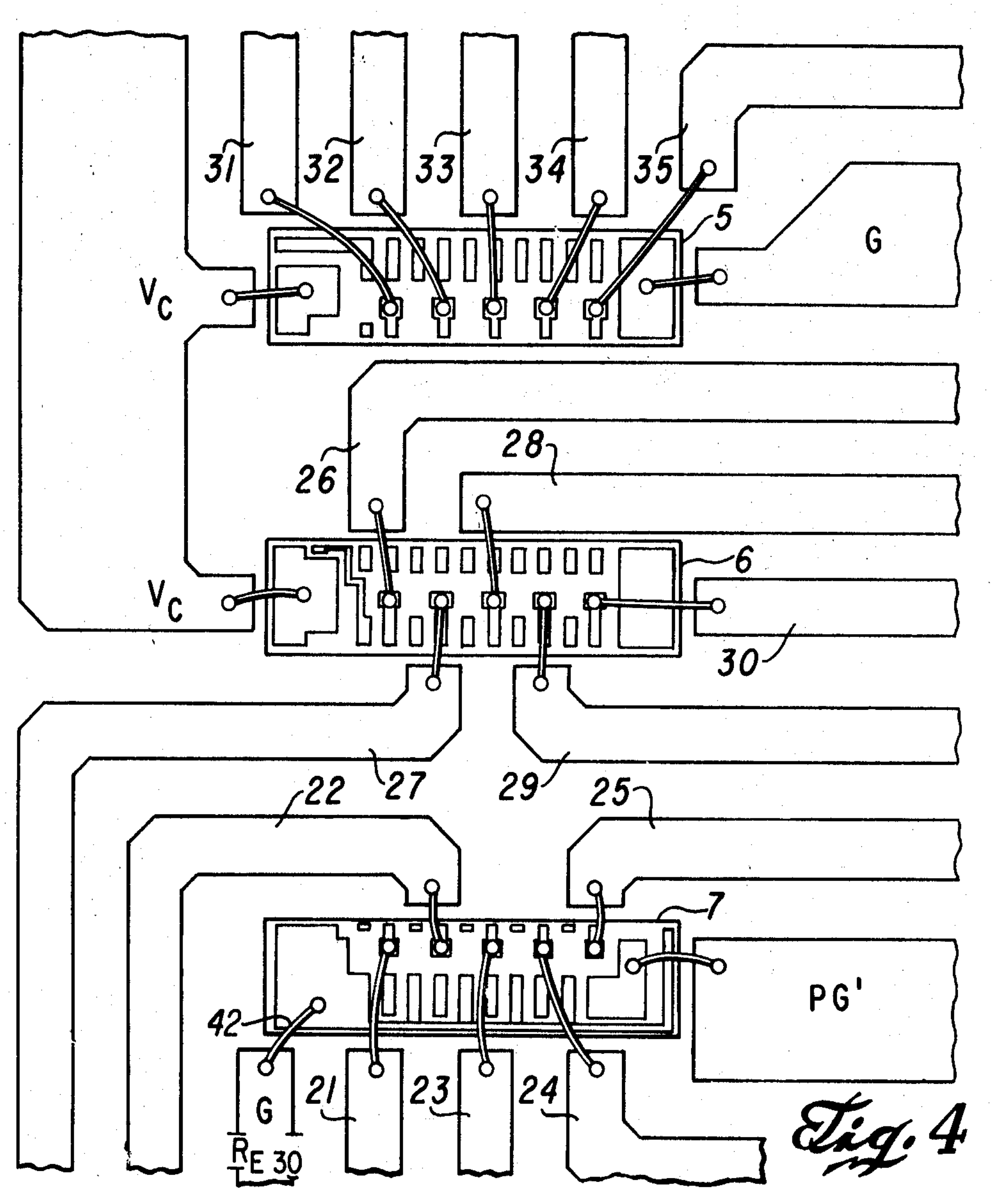
FIG. 4 illustrates the interconnection pattern for external connection to the heater elements and drive matrix of FIG. 1.

FIG. 4 illustrates the bottom view of the support 1 showing the openings 5–7 with the appropriate bonding pads located above the openings.

The epoxy adhesive is then cured into a rigid solid and during the initial curing process, the viscosity of the epoxy adhesive decreases considerably prior to polymerization and hardening. This lower viscosity of the adhesive facilitates flowing of the epoxy adhesive which will not readily "wet" the photoresist material thereby causing the epoxy adhesive to pull away from the photoresist material and collect in the areas around the photoresist material forming a meniscus with the wall of the openings 5–7 in the support 1.

After complete curing of the epoxy adhesive, the photoresist material is removed by conventional techniques leaving the bonding pads free from the epoxy adhesive and clean for making good electrical connections thereto.

The top surface of the semiconductor wafer which is the surface remote from the heater elements and the drive matrix elements is removed to make the semiconductor wafer as thin as desirable. This may be accomplished in one step or in multiple steps using lapping, sand blasting, or chemical etching. However, the integrity of the PN junctions is maintained. Since the thermally sensitive material will be positioned on or passed over the monocrystalline surface of the semiconductor wafer, it is chemically or mechanically polished.

The semiconductor material of wafer 2 around each transistor-resistor pair of a heater element is now removed to leave the 3×5 array of air isolated mesas. A photoresist layer is applied over the top surface of the wafer 2 and a photomask is applied over this photoresist layer to provide the desired exposure pattern for the photoresist layer. The photoresist layer is then exposed through the photomask, developed and selectively removed to leave exposed those areas of the semiconductor surface which are to be removed. With the photoresist layer defining the desired pattern, the semiconductor material is etched down to the silicon oxide film to leave the air isolated mesa shapes as illustrated in FIG. 1.

FIG. 1 illustrates the resulting shape of the semiconductor wafer 2 wherein is located the 3×5 array of isolated mesas.

Referring now to FIG. 4 and looking at the underside of the insulating support 1, a metallic pattern previously applied on the underside of the insulating support 1 is to be connected with the bonding pads on the semiconductor wafer. Connections 42 are bonded between the bonding pads and the conductive strips on the underside of the insulating support 1 through the openings 5–7 in the insulating support.

As can be seen, the terminal strips 21–35 in conjunction with terminal strip PG' provides the input terminals for selectively energizing the heating element array which was previously discussed in connection with input terminals 129, 130 and PG of FIG. 5. The power supply terminals are provided by strips $V_C$ and G to provide the ground and collect voltage connections to the system.

The thermally sensitive material for display purposes is placed in direct contact with the monocrystalline silicon mesas which are very thin thereby allowing a high degree of thermal communication between the mesas and the thermally sensitive material. The heating element array has a high degree of electrical and thermal isolation between the mesas and is particularly suitable for thermal display applications while a high density of circuit elements constituting the drive matrix may be integrated therewith with adequate electrical and thermal isolation.

The 5×3 array of mesas is given herein as an example since any number and shape of the array may be chosen depending upon the character of the information desired to be displayed on the thermally sensitive material.

It is to be understood that the above-described embodiment is merely illustrative of the invention. Numerous other arrangements may be devised by those skilled in the art without departing from the spirit and scope of the invention as defined by the appended claims.

What we claim is:

1. An integrated semiconductor circuit comprising an insulating substrate, a semiconductor wafer having one face mounted on said insulating substrate by an insulating adhesive, said semiconductor wafer comprising a plurality of physically separated wafer parts forming an array located in a first area of said wafer, said wafer parts respectively comprising heat dissipative elements at said one face, said heat dissipative elements being electrically and thermally isolated from one another by the physical separation of said wafer parts, said semiconductor wafer comprising a plurality of circuit elements formed at said one face and located in a spaced second area of said semiconductor wafer, the number of said plurality of circuit elements being at least as large as the number of said plurality of heat dissipative elements, PN junctions in said second area of said semiconductor wafer electrically isolating said plurality of circuit elements from one another through the semiconductor material, said second area of said semiconductor wafer being integral throughout, and conductive means located between said one face and said insulating substrate electrically interconnecting said head dissipative elements and said circuit elements.

2. An integrated semiconductor circuit according to claim 1, wherein the opposite face of said semiconductor wafer is essentially planar, said semiconductor wafer is rectangular in shape and at least two parallel sides of said semiconductor wafer are integral.

3. A semiconductor integrated circuit according to claim 1, wherein said second area of said semiconductor wafer is larger than said first area of said semiconductor wafer.

4. An integrated semiconductor circuit according to claim 3, wherein the number of said plurality of circuit elements is at least twice as large as the number of said plurality of heat dissipative elements.

5. An integrated semiconductor circuit according to claim 2, wherein the other two parallel sides of said semiconductor wafer are integral.

6. An integrated semiconductor circuit according to claim 1, wherein said conductive means comprises a plurality of diffused conductive tunnels in said one face of said semiconductor wafer between said first area and said second area.

7. An integrated semiconductor circuit, comprising an insulating substrate, a smaller semiconductor wafer having one face mounted on said insulating substrate by an insulating adhesive, said semiconductor wafer comprising a plurality of physically separated wafer parts forming an array located in a first area of said wafer, said wafer parts respectively comprising a diffused resistors at said one face, said diffused resistors being electrically and thermally isolated from one another by the physical separation of said wafer parts, said semiconductor wafer comprising a plurality of transistors formed at said one face and located in a larger spaced second area of said semiconductor wafer, the number of said transistors being at least as large as the number of said diffused resistors, P-N junctions in said second area of said semiconductor wafer electrically isolating and transistors from one another through the semiconductor material, said second area of said semiconductor wafer being integral throughout, and conductive means located between said one face and said insulating substrate electrically interconnecting said resistors and said transistors for selectively energizing said resistors.